United States Patent [19]

Garcia et al.

[11] Patent Number: 4,831,286
[45] Date of Patent: May 16, 1989

[54] ENABLED CLOCK CIRCUIT

[75] Inventors: Virgilio N. Garcia, Melbourne Beach, Fla.; Alan S. Hearn, Dallas; Steven E. Sparks, Garland, both of Tex.

[73] Assignee: Texas Instruments Incorporated, Dallas, Tex.

[21] Appl. No.: 102,222

[22] Filed: Sep. 29, 1987

[51] Int. Cl.[4] .............................................. H03K 17/28
[52] U.S. Cl. ................................. 307/480; 307/450; 307/459; 307/596; 307/606; 357/16; 364/900
[58] Field of Search ............... 307/448, 450, 459, 477, 307/480, 591, 593, 596, 606, 291, 272 R, 273, 272 A, 269; 357/16, 92; 364/200 MS File, 900 MS File

[56] References Cited

U.S. PATENT DOCUMENTS

| | | | |
|---|---|---|---|
| 4,056,736 | 11/1977 | Blatt | 307/459 X |
| 4,085,341 | 4/1978 | Reinert | 307/480 X |
| 4,209,715 | 6/1980 | Aoki | 307/459 X |
| 4,441,198 | 4/1984 | Shibata et al. | 307/477 X |
| 4,573,064 | 2/1986 | McLevige et al. | 357/92 X |
| 4,587,440 | 5/1986 | Nakayama et al. | 307/273 X |
| 4,627,085 | 12/1986 | Yuen | 307/480 X |
| 4,654,960 | 4/1987 | McLevige et al. | 357/16 X |
| 4,672,414 | 6/1987 | Gabriel et al. | 357/16 X |
| 4,694,256 | 9/1987 | Kawamura | 307/273 X |
| 4,748,417 | 5/1988 | Spengler | 307/480 X |

OTHER PUBLICATIONS

Ross et al, "Heterojunction GaAs/GaAlAs Transistors With Enhanced Gain From Avalanche Multiplication", IEEE JSSC, vol. 1, No. 2, pp. 53-56, Jan. 1977.
Tabatabaie-Alavi et al, "Gate Delays of InGaAs/InP Heterojunction Integrated Injection Logic", IEEE EDL, vol. EDL-3, No. 8, Aug. 1982, pp. 200-202.

*Primary Examiner*—David Hudspeth
*Attorney, Agent, or Firm*—Melvin Sharp; René E. Grossman; Ferdinand M. Romano

[57] ABSTRACT

A GaAs register for storing of digital data is configured with a plurality of "D" type flip-flops having a data terminal and an enable terminal connected to an enabled GaAs clock circuit. The enabled GaAs clock circuit provides a load clock signal to enable the "D" type flip-flops during the loading of data into the plurality of "D" type flip-flops and to prohibit the loading of data without the load clock signal. The enabled GaAs clock circuit has "D" type flip-flop, a clock input circuit and a combining circuit. The clock input circuit receives a clock signal and delays the clock signal. The "D" type flip-flop loads the load enable signal with the rising edge of the clock signal and the delayed clock signal and the loaded enable signal are combined to obtained a combination signal which is used to load data into the plurality of "D" type flip-flops in the register.

6 Claims, 3 Drawing Sheets (A) CROSSECTION

ENABLED CLOCK CIRCUIT

BACKGROUND OF THE INVENTION

This invention relates to semi-insulator circuits and in particular to Gallium Arsenide circuits connected to form a clock circuit for storing data in a register.

Microprocessors typically have a Arithmetic Logic Unit (ALU) that is connected to a register file in which the operands that are to be operated upon by the ALU are stored. When a particular register in the register file is addressed an enabled then the contents of that register is applied to the ALU for adding to the contents to a second register in the register file that is also addressed and enabled. The output of the ALU is then stored in an output register.

The registers to minimize the effects of line transients have traditionally been configured with "D" type flip-flops. The prior art "D" type flip-flop loads on every clock cycle when used in a microprocessor. To save the data stored in the register a feedback loop is required form the Q output to the D input of the flip-flop to reload the "D" type flip-flop on each new clock pulse. This circuit necessitates a reload gate and creates fan out problems for the reload clock circuit especially when for speed the circuits are configured with GaAs Heterojunction Integrated Injection Logic ($HI^2L$) gates.

SUMMARY OF THE INVENTION

A GaAs register for storing of digital data is configured with a plurality of "D" type flip-flops having a data terminal and an enable terminal connected to a enabled GaAs clock circuit. The enabled GaAs clock circuit provides a load clock signal to enable the "D" type flip-flops during the loading of data into the plurality of "D" type flip-flop and to prohibit the loading of data without the load clock signal. The enabled GaAs clock circuit has "D" type flip-flop, a clock input circuit and a combining circuit. The clock input circuit receives a clock signal and delays the clock signal. The "D" type flip-flop loads the load enable signal with the rising edge of the clock signal and the delayed clock signal and the loaded enable signal are combined to obtain a combination signal which is used to load data into the plurality of "D" type flip-flops in the register.

The combination of signals because of the use of $HI^2L$ gates is performed by a wired AND circuit.

The GaAs register includes a plurality of "D" type flip-flops that provide high speeds with a minimum number of gates.

These and other objects and advantages will be apparent from a reading of the specification in conjunction with the figures in which:

DETAILED DESCRIPTION OF THE EMBODIMENTS

Figure 1:
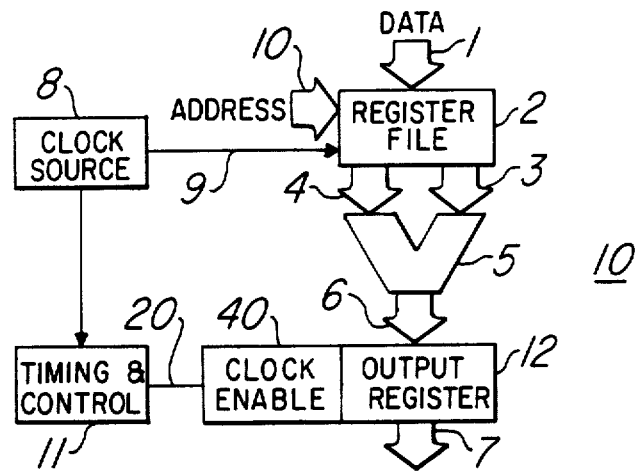
FIG. 1 is a block diagram of a GaAs microprocessor system.

FIG. 1, to which reference should now be made, is a simplified block diagram of a GaAs microprocessor system such as that disclosed in the October 1986 issue of the IEEE publication, Computer, entitled "Reduced Instruction Set Architecture for a GaAs Microprocessor System" by Fox et al which by reference is incorporated herein. A register file 2 stores operands for use by an ALU 5 in the form of data provided thereto via a data bus 1. When the register file 2 is addressed by addresses supplied thereto by an address bus 10. The operands are applied to the ALU 5 by data buses 3 and 4. After the ALU 5 has mathematically combined the two operands, the output is stored in an output register 12 which is a plurality of parallel connected "D" type flip-flops which stores and provides the results to the output data bus 7.

Figure 2:
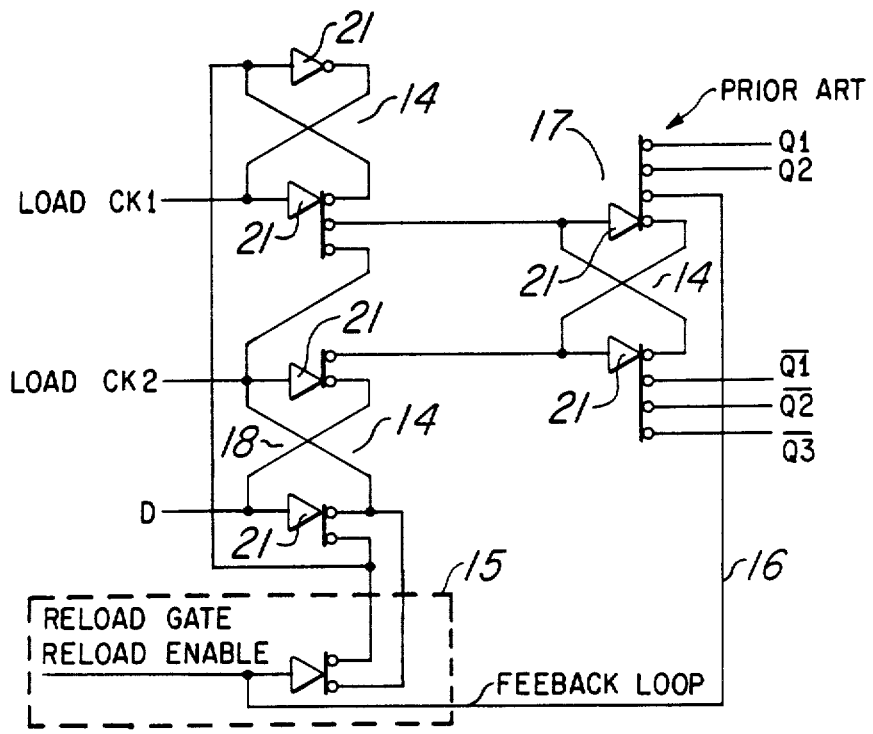
FIG. 2 is a schematic diagram of a prior art "D" type flip-flop used to configure a GaAs register for the microprocessor of FIG. 1.

As is shown in FIG. 1, the output register 12 includes a plurality of "D" type flip-flops. FIG. 2 illustrates the prior art circuit arrangement for configuring the "D" type flip-flop which includes 3 latche stages 14 configured with GaAs Heterojunction Integrated Injection Logic ($HI^2L$) gates. A feedback loop 16 connects one of the Q outputs from the Q output gate 17 to a reload gate 15 that reloads the D input latch with the Q output data, when the reload enable signal is present. When the reload enable signal is not present then the data on the D terminal is loaded into the "D" type flip-flop on the rising edges clock signal that is represented by the fan out clocks, ck1 and ck2.

Figure 3:
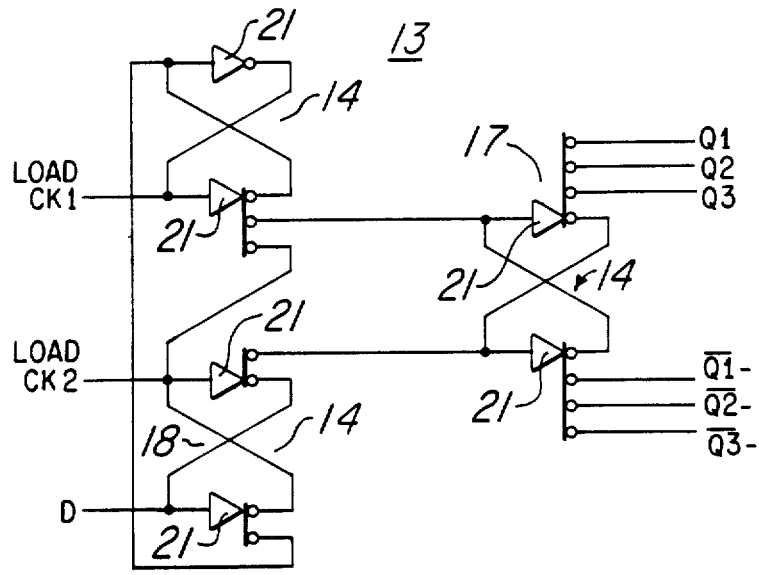
FIG. 3 is a schematic diagram of a "D" type flip-flop used to configure a GaAs register for the microprocessor of FIG. 1 according to the invention.

The "D" type flip-flop 13 of FIG. 1 is illustrated in FIG. 3 and includes 3 latch circuits 14 configured with GaAs Heterojunction Integrated Injection Logic ($HI^2L$) gates. There is not present the feedback loop of FIG. 2 nor is there a requirement for the reload gate 15. The reason for this reduced circuit configuration is because of the enabled GaAs clock circuit disclosed in FIG. 4.

The timing and control logic 11 provides the load signal to the enabled GaAs clock circuit 40 and in particular to the D terminal of "D" type flip-flop 25 via conductor 26. Clock source 8 provides a clock signal to the enabled GaAs clock circuit 40 where it is buffered by a first GaAs Heterojunction Integrated Injection Logic ($HI^2L$) gate 23 and inverted by a second GaAs Heterojunction Integrated Injection Logic ($HI^2L$) gate 24 which divides the clock signal into two signals one of which is applied to the clock terminal of "D" type flip-flop 25 and the second signal is applied to four series connected GaAs Heterojunction Integrated Injection Logic ($HI^2L$) gates 28,29,30 and 31 which provide compensation for the propagation gate delays through the "D" type flip-flop 40. The Q output of the "D" type flip-flop 40 is ANDED with the output from the GaAs Heterojunction Integrated Injection Logic ($HI^2L$) gate 31 to obtain a clock load signal at wired AND point 27. Circuit 33 is a clock fan circuit that provides the load ck1 and load ck2 signals for use by the "D" type flip-flop 13 that are used to configure the register 12.

Figure 4:
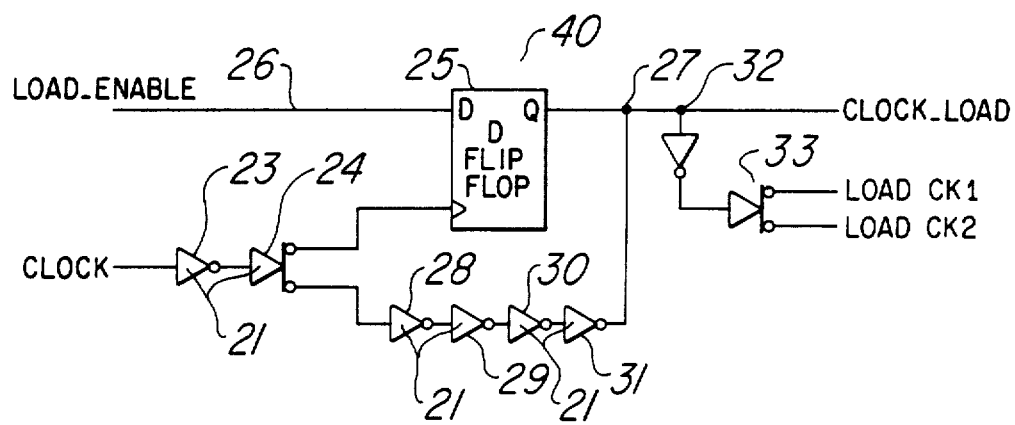
FIG. 4 is a block diagram of an enabled GaAs clock circuit for clocking the according to the invention.
Figure 5:
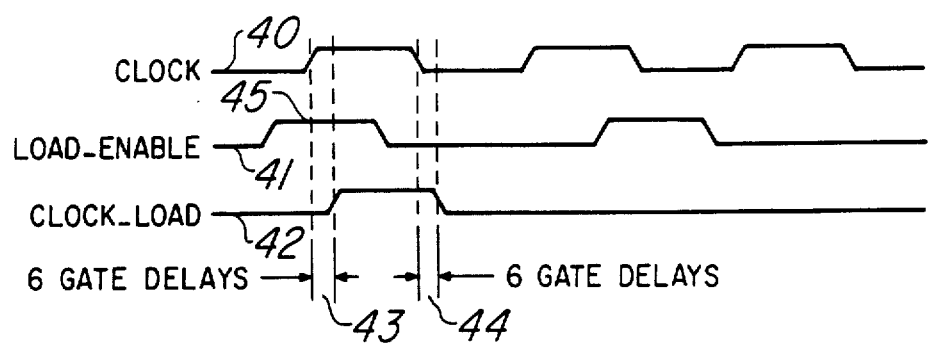
FIG. 5 is a waveform diagram showing the timing for the operation of the enabled GaAs clock circuit circuit of FIG. 4.

FIG. 5 illustrates the timing of the circuit of FIG. 4 and illustrates at 40 the waveform of the clock signal. When the load enable signal is present at the rising edge of the clock signal (point 45 of waveform 41) the "D" type flip-flop 25 loads that signal and after six gate delays caused by GaAs Heterojunction Integrated Injection Logic (HI$^2$L) gates 23, 24, 28, 29, 30 and 31 the clock load signal appears on the Q output of the "D" type flip-flop 25. Point 43 illustrates this operation. Because of the AND function at point 27 the clock load signal is remove from the Q output six gate delays after the termination of the clock pulse as is illustrated at point 44.

Figure 6:
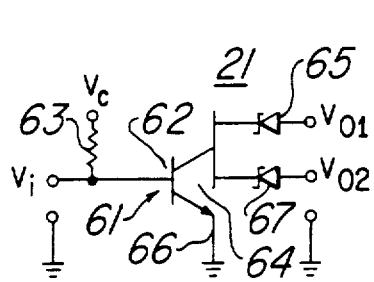
FIG. 6 is a schematic diagram of the gates used in the embodiments of FIGS. 3 and 4.

FIG. 6 is a schematic diagram of each gate 21 that is used to practice this invention. Other types of HI$^2$L gates such as those described in U.S. Pat. Nos. 4,573,064; 4,654,960 and 4,672,414 may be used to practice the invention. Although some of the gates 21 are illustrated having a single output others have multiple outputs, the number of Schottky diodes on the output circuit can be selected in the manufacturing process to achieve the desired arrangement. There is a pull up register 63 that is connected to the base 62 of a transistor 61. The emitter 65 is grounded and the collector 64 is connected to the output Schottky diodes 65 and 67. Using HI$^2$L logic, the AND functions are wire AND as is shown in the previous discussions with the outputs being fanned out through the use of the connection of the Schottky diodes 65 and 67. With the HI$^2$L gate configuration any of the disclosed circuit logic configurations can be achieved with the gate of FIG. 6.

Figure 7:
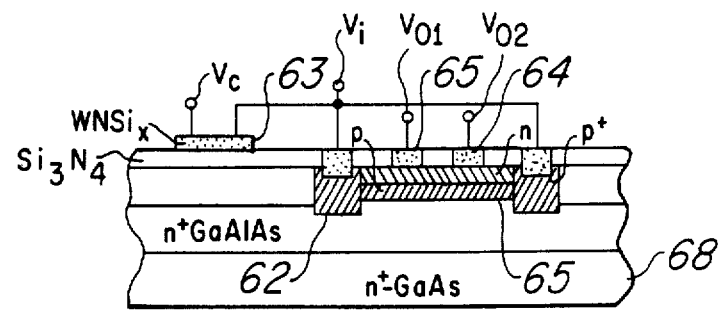
FIG. 7 is a cross sectional diagram illustrating the fabrication of the gate of FIG. 6 in GaAs.

FIG. 7 illustrates a cross sectional view of a simplified of the HI$^2$L gate of FIG. 6 in which tungsten nitride silicide is used to create the resistor 63. The base 62 and the Schottky diode 65 and 67 are shown as is the emitter 65. These devices are fabricated on a slice of GaAs 68 as is shown in FIG. 7.

Accordingly, I claim:

1. A microprocessor comprising:
    a register bank comprising a plurality of individual data registers; and
    a logic device having a first input for receiving a clock signal, a second input for receiving a control signal and an output for providing a signal indicative of the control signal at the rising edge of the clock signal,
    said output connected to receive a delayed version of the clock signal with the connection between said output and the delayed clock signal providing a signal corresponding to a wired AND of the delayed clock signal and a logic device output signal, the connection also coupled to said register bank to control clocking and control of data in and out of individual registers with the wired AND signal.

2. The microprocessor of claim 1 wherein the logic device is a D type flip flop.

3. The microprocessor of claim 1, further comprising a plurality of serially connected delay devices connected to provide said delayed clock signal.

4. The microprocessor of claim 3 wherein the delay devices are GaAs logic gates.

5. The microprocessor of claim 3 wherein the delay devices provide delays greater than signal propagation delays through the logic device.

6. The microprocessor of claim 2 wherein the individual data registers are D type flip flops.

* * * * *